United States Patent
Cavarroc et al.

(10) Patent No.: US 12,084,755 B2
(45) Date of Patent: Sep. 10, 2024

(54) METHOD FOR COATING A SUBSTRATE WITH TANTALUM NITRIDE

(71) Applicants: SAFRAN, Paris (FR); CENTRE NATIONAL DE LA RECHERCHE SCIENTIFIQUE, Paris (FR); UNIVERSITE DE BORDEAUX, Bordeaux (FR)

(72) Inventors: Marjorie Christine Cavarroc, Moissy-Cramayel (FR); Baptiste Simon Giroire, Bordeaux (FR); Lionel Teule-Gay, Bordeaux (FR); Angélique Poulon, Arsac (FR)

(73) Assignees: SAFRAN, Paris (FR); CENTRE NATIONAL DE LA RECHERCHE SCIENTIFIQUE, Paris (FR); UNIVERSITE DE BORDEAUX, Bordeaux (FR)

( * ) Notice: Subject to any disclaimer, the term of this patent is extended or adjusted under 35 U.S.C. 154(b) by 235 days.

(21) Appl. No.: 17/616,828

(22) PCT Filed: May 14, 2020

(86) PCT No.: PCT/FR2020/050801
§ 371 (c)(1),
(2) Date: Dec. 6, 2021

(87) PCT Pub. No.: WO2020/249879
PCT Pub. Date: Dec. 17, 2020

(65) Prior Publication Data
US 2022/0349042 A1   Nov. 3, 2022

(30) Foreign Application Priority Data
Jun. 11, 2019   (FR) .................................... 1906168

(51) Int. Cl.
*C23C 14/34* (2006.01)
*C23C 14/00* (2006.01)
(Continued)

(52) U.S. Cl.
CPC ...... *C23C 14/3485* (2013.01); *C23C 14/0036* (2013.01); *C23C 14/0641* (2013.01);
(Continued)

(58) Field of Classification Search
CPC .............. C23C 14/3464; C23C 14/345; C23C 14/3485; C23C 14/0036; C23C 14/0641;
(Continued)

(56) References Cited

U.S. PATENT DOCUMENTS

| 6,110,598 A | 8/2000 | Maeda et al. |
| 6,896,773 B2 * | 5/2005 | Chistyakov ........... C23C 14/542 |
| | | 204/192.12 |

(Continued)

FOREIGN PATENT DOCUMENTS

| EP | 2 325 349 A1 | 5/2011 |
| WO | WO 2009/122378 A1 | 10/2009 |

(Continued)

OTHER PUBLICATIONS

Koller et al. "Structure phase evolution, and mechanical properties of DC, pulsed DC, and high power impulse magnetron sputtered Ta—N films", Surface & Coatings Technology 347 (2018) pp. 304-312. (Year: 2018).*

(Continued)

*Primary Examiner* — Rodney G McDonald
(74) *Attorney, Agent, or Firm* — Pillsbury Winthrop Shaw Pitman LLP

(57) ABSTRACT

A process for coating a substrate with tantalum nitride by the high-power impulse magnetron sputtering technique, wherein a tantalum target is used and wherein the coating of (Continued)

the substrate is carried out in an atmosphere containing nitrogen, the bias of the target being controlled during the coating by imposing on it the superposition of a continuous bias at a potential between −300 V and −100 V and of a pulsed bias whose pulses have a potential between −1200 V and −400 V.

7 Claims, 2 Drawing Sheets

(51) Int. Cl.
    *C23C 14/06*     (2006.01)
    *C23C 14/35*     (2006.01)
    *H01J 37/34*     (2006.01)

(52) U.S. Cl.
    CPC .......... *C23C 14/35* (2013.01); *H01J 37/3405* (2013.01); *H01J 37/3426* (2013.01); *H01J 37/3467* (2013.01); *H01J 2237/332* (2013.01)

(58) Field of Classification Search
    CPC ... C23C 14/35; H01J 37/3405; H01J 37/3426; H01J 37/3467; H01J 2237/332
    USPC .......................... 204/298.06, 298.08, 192.15
    See application file for complete search history.

(56) References Cited

U.S. PATENT DOCUMENTS

2004/0055881 A1    3/2004   Christie
2013/0256119 A1*  10/2013  Yang .................. C23C 14/3485
                                              204/192.12

FOREIGN PATENT DOCUMENTS

WO    WO 2014/154894 A1   10/2014
WO    WO 2018/215410 A1   11/2018

OTHER PUBLICATIONS

Zaman et al. "Microstructure and Mechanical Properties of TaN Thin Films Prepared by Reactive Magnetron Sputtering", Coatings 2017, 7, 209. (Year: 2017).*

International Search Report as issued in International Patent Application No. PCT/FR2020/050801, dated Oct. 9, 2020.

* cited by examiner

[Fig. 1]
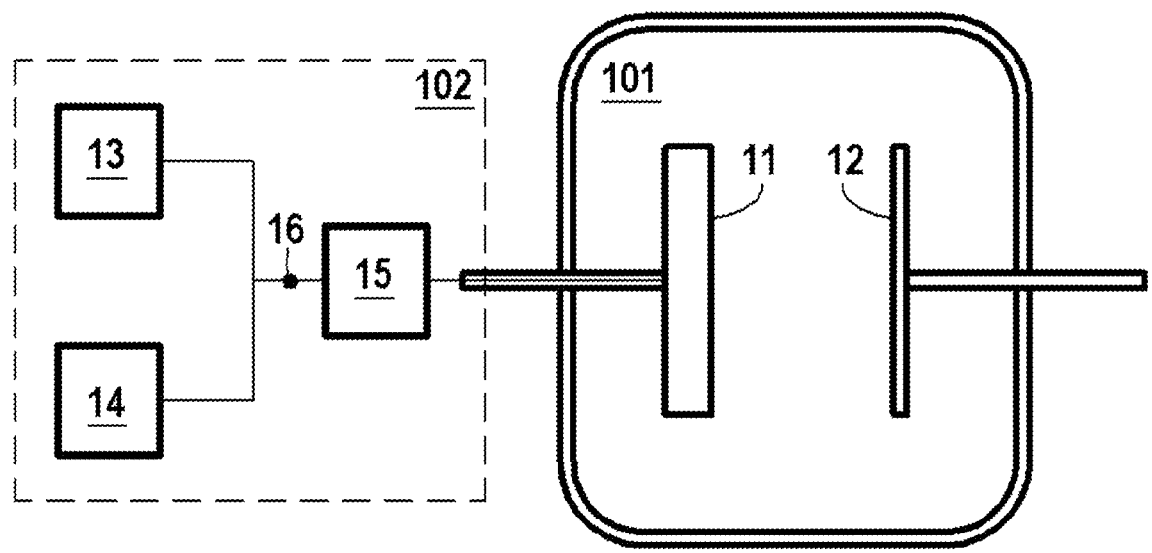
[Fig. 2]
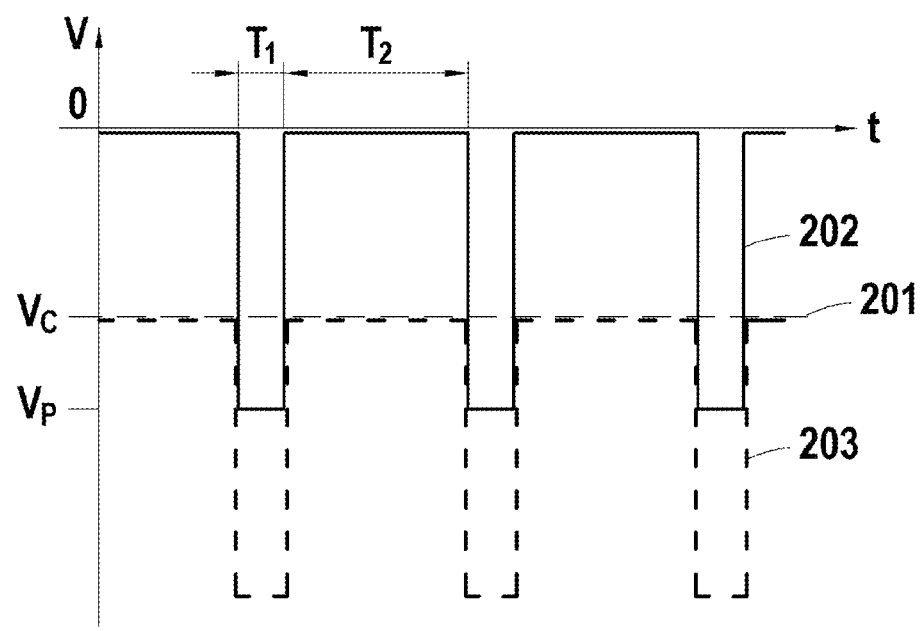

[Fig. 3]
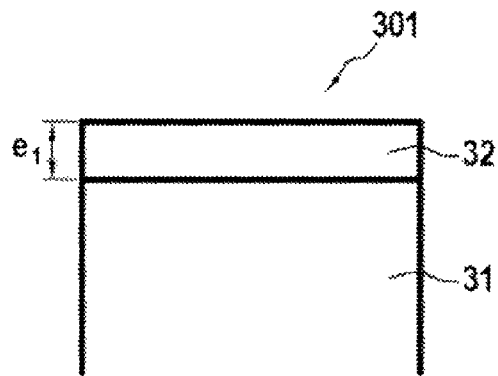
[Fig. 4]
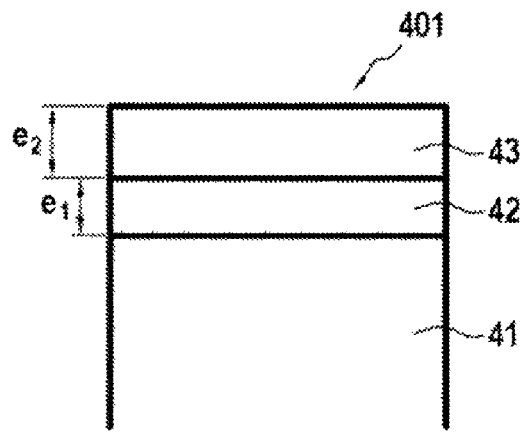
[Fig. 5]
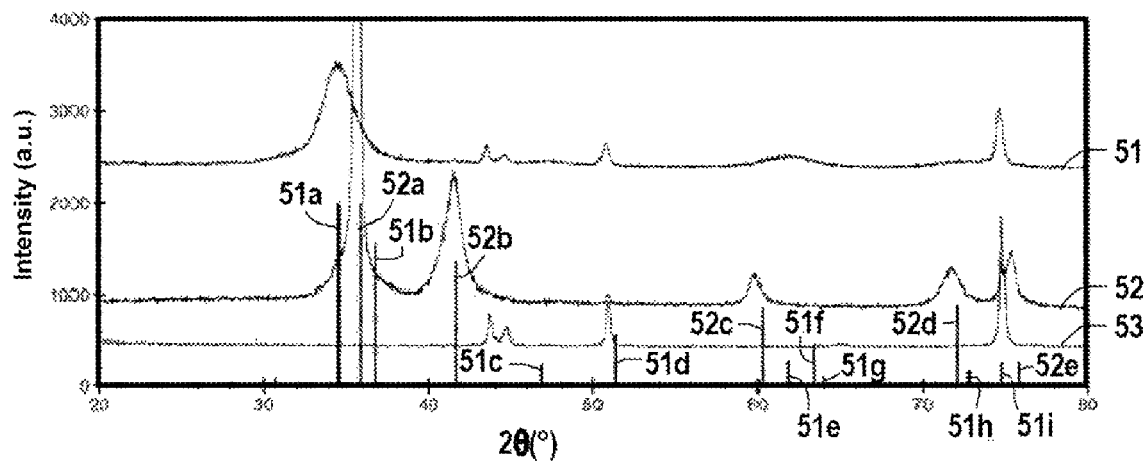

METHOD FOR COATING A SUBSTRATE WITH TANTALUM NITRIDE

CROSS-REFERENCE TO RELATED APPLICATIONS

This application is the U.S. National Stage of PCT/FR2020/050801, filed May 14, 2020, which in turn claims priority to French patent application number 1906168 filed Jun. 11, 2019. The content of these applications are incorporated herein by reference in their entireties.

TECHNICAL FIELD

The invention relates to a process for coating a substrate with at least one layer of tantalum nitride, with a view to replace chromium(VI)-based coatings.

PRIOR ART

In order to improve the properties of metal substrates, in particular in terms of resistance to corrosion or to wear, it is known to coat them with a protective layer. As such, chromium(VI) oxide is particularly advantageous in that it has good hardness, high resistance to fatigue and to corrosion, and also good thermal and chemical stability. However, in the context of legal developments and the REACH regulation, these chromium coatings must be replaced. It is therefore necessary to have replacement solutions with at least equivalent physico-chemical properties that are compatible with industrial, economic and environmental requirements.

DISCLOSURE OF THE INVENTION

The invention relates to a process for coating a substrate with tantalum nitride by the high-power impulse magnetron sputtering technique, in which a tantalum target is used and in which the coating of the substrate is carried out in an atmosphere containing nitrogen, the bias of the target being controlled during the coating by imposing on it the superposition of a continuous bias at a potential comprised between −300 V and −100 V and of a pulsed bias whose pulses are at a potential comprised between −1200 V and −400 V.

The invention is based on the use of a high-power impulse magnetron sputtering (HiPIMS) technique in which the target is biased in a particular manner to form a tantalum nitride coating which is a satisfactory material for replacing chromium(VI) oxides. Continuous bias allows a residual plasma to be maintained when pulses are not applied, and thus limits the additional energy required to initiate the plasma to form the coating. Pulsed bias then allows for a significant increase in plasma reactivity and thus the creation of charged species in the plasma in much greater numbers than would be possible without continuous bias. The presence of a residual plasma maintained by the continuous bias also reduces the electrical instabilities that can occur during the application of the pulses. This allows for fine control of the microstructure of the resulting tantalum nitride coating.

The process may allow for the coating of a substrate with at least one layer of hexagonal or face-centered cubic tantalum nitride depending on the operating conditions selected.

In an embodiment, the substrate is coated with at least hexagonal tantalum nitride by imposing on the target the superposition of a continuous bias at a potential comprised between −199 V and −100 V and of a pulsed bias whose pulses have a potential comprised between −900 V and −701 V.

Such a hexagonal tantalum nitride coating is particularly advantageous in that it has a higher hardness than chromium-based coatings while exhibiting good resistance to oxidation and to corrosion.

In another embodiment, the substrate is coated with at least face-centered cubic tantalum nitride by imposing on the target the superposition of a continuous bias at a potential comprised between −300 V and −200 V and of a pulsed bias whose pulses have a potential comprised between −700 V and −500 V.

Such a face-centered cubic tantalum nitride coating is particularly advantageous in that it has good chemical and structural stability at temperatures greater than 800° C.

In another embodiment, the substrate is coated with hexagonal tantalum nitride using a process imposing bias conditions as defined above, and with face-centered cubic tantalum nitride using a process imposing bias conditions as defined above.

Such an embodiment may make it possible to obtain a coating having a microstructure gradient, comprising both face-centered cubic tantalum nitride and hexagonal tantalum nitride. The hexagonal tantalum nitride coating may be deposited on the previously formed face-centered cubic tantalum nitride coating or, conversely, the face-centered cubic tantalum nitride coating may be deposited on the previously formed hexagonal tantalum nitride coating.

By controlling the microstructure of the coating, it can be adapted to the stresses and strains of the application, for example to avoid any risk of delamination of the coating and to deflect any cracks that may have formed during operation.

In an embodiment, the substrate is biased at a strictly negative potential greater than or equal to −200 V.

The application of such a substrate bias makes it possible to obtain denser tantalum nitride layers.

In an embodiment, the atmosphere is a mixture of argon and nitrogen, the nitrogen content by volume in the atmosphere being comprised between 1% and 30% and the argon content by volume in the atmosphere being comprised between 70% and 99%.

The invention is applicable to coating a wide variety of substrates depending on the intended application. In an embodiment, the substrate may be metallic, for example, a metal alloy and in particular a steel.

In another embodiment, the substrate is a superalloy, for example a nickel or cobalt superalloy. In another embodiment, the substrate is a titanium or aluminum alloy.

The substrate may be an aircraft component, for example an aircraft landing gear part or an aircraft turbomachine component. In particular, the substrate may be an aircraft turbine component.

In a particular embodiment, the process makes it possible to form a coating of hexagonal tantalum nitride on a superalloy substrate.

DESCRIPTION OF THE FIGURES

FIG. 1 schematically describes a device for carrying out an example of a coating process according to the invention.

FIG. 2 schematically describes the bias of the target overtime during a coating process according to the invention.

FIG. 3 schematically describes a substrate coated by implementing an embodiment of the invention.

FIG. 4 schematically describes a substrate coated by carrying out another embodiment of the invention.

FIG. 5 is an X-ray diffractogram for substrates coated by different embodiments of the invention.

DESCRIPTION OF THE EMBODIMENTS

The invention will now be described by means of the figures provided by way of illustration and should not be interpreted as limiting the scope of the invention.

FIG. 1 schematically represents a device for performing a high-power impulse magnetron sputtering deposition according to an embodiment of the invention.

The device includes a chamber 101 for receiving a plasma gas, for example consisting of a mixture of argon and nitrogen. The device further comprises a source of plasma gas (not shown) in communication with the chamber 101.

The chamber 101 comprises a tantalum target 11 constituting the cathode and a substrate 12 to be coated constituting the anode. In an embodiment, the target 11 comprises tantalum in excess of 99 at. %, and preferably in excess of 99.9 at. %. The substrate 12 to be coated is electrically conductive and may vary in nature depending on the intended application as noted above.

During coating, the target 11 is biased as described above by superimposing a continuous bias and a pulsed bias. The bias of the target 11 is imposed by the power supply assembly 102. The power supply assembly 102 includes a voltage pulse generator 13 and a continuous voltage generator 14 electrically connected to the target 11. The voltage pulse generator 13 is used to impose the pulsed bias on the target 11. The continuous voltage generator 14 is used to impose the continuous bias on the target 11. This assembly 102 may also include a current measuring member 16 connected to a current cutoff device 15. During use, if the current value measured by the current measuring member 16 is greater than a threshold value, the current cut-off device 15 is configured to cut off power to the target 11 and thereby stop the process. The combination of the current measuring member 16 and the current cut-off device 15 prevents any risk of damage to the coating or the device due to the creation of an electric arc in the chamber 101. Such a combination of elements 15 and 16 is known per se.

In the chamber 101, a plasma is created by applying a voltage between the target 11 and the substrate 12 in the presence of an atmosphere comprising nitrogen. Electrons are generated by the target 11 and can ionize the constituent atoms of the plasma by collision. One or more permanent magnets, not shown, may be introduced into the chamber 101 in the vicinity of target 11, the magnetic field of which confines the generated electrons to the vicinity of the target 11 and increases the likelihood that a collision between an electron and an atom in the plasma will occur. When such a collision occurs, a high-energy species is generated that can bombard the target 11 and tear particles from the target 11 by elastic shock. The particles torn off the target 11 can then be deposited on the substrate 12 to form the coating.

The coating may be carried out under vacuum, for example at a pressure in chamber 101 less than or equal to 2 Pa, for example comprised between 0.5 Pa and 2 Pa.

The substrate may be heated during coating by a heater not shown. Alternatively, the substrate may not be heated during coating. For example, the temperature of the substrate may be greater than or equal to 20° C. during the coating, for example comprised between 20° C. and 600° C., or even comprised between 30° C. and 500° C.

The temperature provides the substrate with thermal energy, and thus allows a certain mobility of the atoms promoting the recombination of the atoms deposited on the surface of the substrate.

FIG. 2 represents the bias 203 imposed on the target overtime. As shown, the bias 203 imposed on the target corresponds to the superposition of a continuous bias 201 of value Vc, and a pulsed bias 202 having pulses at potential Vp.

The pulsed bias 202 is characterized by the potential of its pulses Vp, the duration of the pulses T1, and the duration T2 during which no pulses are applied corresponding to the duration between two consecutive pulses. The pulsed bias 202 comprises a succession of pulses alternating with phases of non-application of the pulses. Each pulse has a plateau at a potential Vp comprised between −1200 V and −400 V. The duration T1 of each pulse may be comprised between 5 µs and 50 µs. The pulsed bias 202 may be periodic, for example with a pulse frequency comprised between 50 Hz and 500 Hz. The duty cycle of the pulsed bias, corresponding to the ratio of the duration of the pulses to the period of the pulsed bias, in this case T1/(T1+T2) may be comprised between 1% and 50%.

A form of pulses in crenelated form has been represented but these could alternatively have a peak form with a peak at a potential comprised between −1200 V and −400 V.

FIG. 3 shows an assembly 301 comprising a substrate 31 coated with a coating 32 of thickness e1 obtained by an embodiment of the process. The coating 32 may be either hexagonal tantalum nitride or face-centered cubic tantalum nitride depending on the biases selected for pulsed and continuous bias. The thickness e1 of the coating 32 is controlled by the deposition time. The tantalum nitride coating 32 may be deposited in contact with the substrate 31.

For example, the thickness e1 of the tantalum nitride coating 32 obtained may be comprised between 1 nm and 50 µm. The duration during which the substrate 31 is coated may be comprised between 5 seconds and 100 hours.

FIG. 4 shows an assembly 401 comprising a substrate 41 coated with a first coating 42 of thickness e1 and a second coating 43 of thickness e2 obtained by varying during deposition the values of the bias imposed on the target between those permitting deposition of hexagonal tantalum nitride and those permitting deposition of face-centered cubic tantalum nitride or vice versa. Thus, it is possible to obtain a coating on the surface of a substrate 41 comprising a first layer 42 of face-centered cubic or hexagonal tantalum nitride, and a second layer 43 of face-centered cubic or hexagonal tantalum nitride different from the first layer 42 and covering the first layer 42. The first layer 42 may be deposited in contact with the substrate 41. The second layer 43 may be deposited in contact with the first layer 42.

The thicknesses e1 and e2 of the first and second coatings 42, 43 may be identical or different. As mentioned above, the thicknesses are controlled by the duration of the deposition process.

Only one variation of the bias conditions has been described above which allows for a coating with first and second layers of tantalum nitride, but embodiments including more than one variation of the bias conditions are to be considered as part of the invention. Thus, a multilayer tantalum nitride coating with more than two layers can be obtained with variation of the tantalum nitride microstructure between the different layers.

FIG. 5 is a diffractogram obtained by X-ray diffraction of two coated substrates obtained by the invention 51 and 52.

The diffractograms 51 and 52 were obtained for deposits made on a steel substrate under a pressure of 2 Pa and in an atmosphere with a composition of 10 vol. % nitrogen and 90 vol.% argon.

The diffractogram 51 is obtained for a deposit made on a steel substrate, by imposing on the target the superposition of a continuous bias at a potential of −250 V and of a pulsed bias whose pulses have a potential of −620 V, a duration of 40 µs and a frequency of 1200 Hz. The power of the magnetron cathode is 16 W, the substrate temperature is 400° C., and a continuous bias of −150 V is applied to the substrate.

The diffractogram 52 is obtained for a deposit made by imposing on the target the superposition of a continuous bias at a potential of −150 V and of a pulsed bias whose pulses have a potential of −800 V, a duration of 40 µs and a frequency of 1200 Hz. The magnetron cathode power is 59 W, the substrate temperature is 400° C., and no continuous bias is applied to the substrate.

Also shown are the theoretical diffraction peaks of face-centered cubic tantalum nitride 51a-51i and the theoretical diffraction peaks of hexagonal tantalum nitride 52a-52e.

Also shown in FIG. 5 is the diffractogram 53 obtained for a steel identical to that used as a substrate for the coatings characterized in diffractograms 51 and 52.

The diffractograms of the coated substrates 51 and 52 show well the characteristic peaks of face-centered cubic tantalum nitride and hexagonal tantalum nitride, respectively, confirming that the parameters described above do indeed permit the selective obtaining of the coatings described.

The expression "comprised between . . . and . . ." should be understood to include the bounds.

The invention claimed is:

1. A process for coating a substrate with tantalum nitride by a high-power impulse magnetron sputtering technique, wherein a tantalum target is used and the process comprising depositing the coating of the substrate in an atmosphere containing nitrogen, a bias of the target being controlled during the coating by imposing on the target a superposition of a continuous bias at a potential comprised between −300 V and −100 V and of a pulsed bias whose pulses have a potential comprised between −1200 V and −400 V,
   wherein the process comprises at least one of:
   (a) coating the substrate with at least hexagonal tantalum nitride by imposing on the target the superposition of a continuous bias at a potential comprised between −199 V and −100 V and of a pulsed bias whose pulses have a potential comprised between −900 V and −701 V, and
   (b) coating the substrate with at least face-centered cubic tantalum nitride by imposing on the target the superposition of a continuous bias at a potential comprised between −300 V and −200 V and of a pulsed bias whose pulses have a potential comprised between −700 V and −500 V.

2. The coating process as claimed in claim 1, wherein the substrate is coated with hexagonal tantalum nitride by imposing on the target the superposition of a continuous bias at a potential comprised between −199 V and −100 V and of a pulsed bias whose pulses have a potential comprised between −900 V and −701 V, and by face-centered cubic tantalum nitride by imposing on the target the superposition of a continuous bias at a potential comprised between −300 V and −200 V and of a pulsed bias whose pulses have a potential comprised between −700 V and −500 V.

3. The coating process as claimed in claim 1, wherein the substrate is biased at a strictly negative potential greater than or equal to −200 V.

4. The coating process as claimed claim 1, wherein the substrate is metallic.

5. The coating process as claimed in claim 4, wherein the substrate is a steel.

6. The process as claimed in claim 1, wherein the substrate is an aircraft component.

7. The coating process as claimed in claim 1, wherein the atmosphere is a mixture of argon and nitrogen, the nitrogen content by volume in the atmosphere being comprised between 1% and 30% and the argon content by volume in the atmosphere being comprised between 70% and 99%.

* * * * *